(12) United States Patent
Choi et al.

(10) Patent No.: US 11,048,350 B2
(45) Date of Patent: Jun. 29, 2021

(54) DISPLAY DEVICE

(71) Applicant: Samsung Display Co., Ltd., Yongin-si (KR)

(72) Inventors: Jae Ho Choi, Yongin-si (KR); Jae Yong Lee, Yongin-si (KR); Chang Won Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/704,564

(22) Filed: Dec. 5, 2019

(65) Prior Publication Data
US 2020/0301535 A1   Sep. 24, 2020

(30) Foreign Application Priority Data

Mar. 20, 2019   (KR) .......................... 10-2019-0031985

(51) Int. Cl.
G06F 3/041 (2006.01)

(52) U.S. Cl.
CPC ........ G06F 3/0412 (2013.01); *G06F 3/04164* (2019.05); *G06F 2203/04107* (2013.01)

(58) Field of Classification Search
None
See application file for complete search history.

(56) References Cited

U.S. PATENT DOCUMENTS

| 2007/0045626 | A1* | 3/2007 | Murade | G02F 1/13458 257/59 |
|---|---|---|---|---|
| 2014/0176399 | A1* | 6/2014 | Lee | H01L 27/3276 345/55 |
| 2017/0097713 | A1* | 4/2017 | Jin | G06F 3/0412 |
| 2018/0182822 | A1 | 6/2018 | Seo et al. | |
| 2019/0067404 | A1* | 2/2019 | Lee | H01L 51/5056 |
| 2019/0103455 | A1* | 4/2019 | Song | G09G 3/3225 |
| 2019/0155430 | A1* | 5/2019 | Hwang | G06F 3/0416 |
| 2019/0273124 | A1* | 9/2019 | Leng | H01L 51/0097 |
| 2019/0341439 | A1* | 11/2019 | Choi | G09G 3/3291 |
| 2019/0386032 | A1* | 12/2019 | Hsu | H01L 27/1218 |
| 2020/0183240 | A1* | 6/2020 | Hsieh | G06F 3/04164 |

FOREIGN PATENT DOCUMENTS

KR   10-2018-0075784   7/2018

* cited by examiner

Primary Examiner — Dorothy Harris
(74) Attorney, Agent, or Firm — H.C. Park & Associates, PLC

(57) ABSTRACT

A display device includes: a substrate including a display region having pixels and a non-display region disposed along at least part of the periphery of the display region; first lines in the non-display region of the substrate; a first insulating layer disposed on the first lines; second lines disposed on the first insulating layer in the non-display region; a second insulating layer disposed on the second lines; a third line disposed on the second insulating layer, the third line overlapping portions of the first and second lines in the non-display region; a third insulating layer disposed on the third line, the third insulating layer exposing a portion of the third line in a first region that overlaps with the first and second lines; and a fourth line on the third insulating layer, the fourth line overlapping the third line and in direct contact with the third line in the first region.

20 Claims, 6 Drawing Sheets

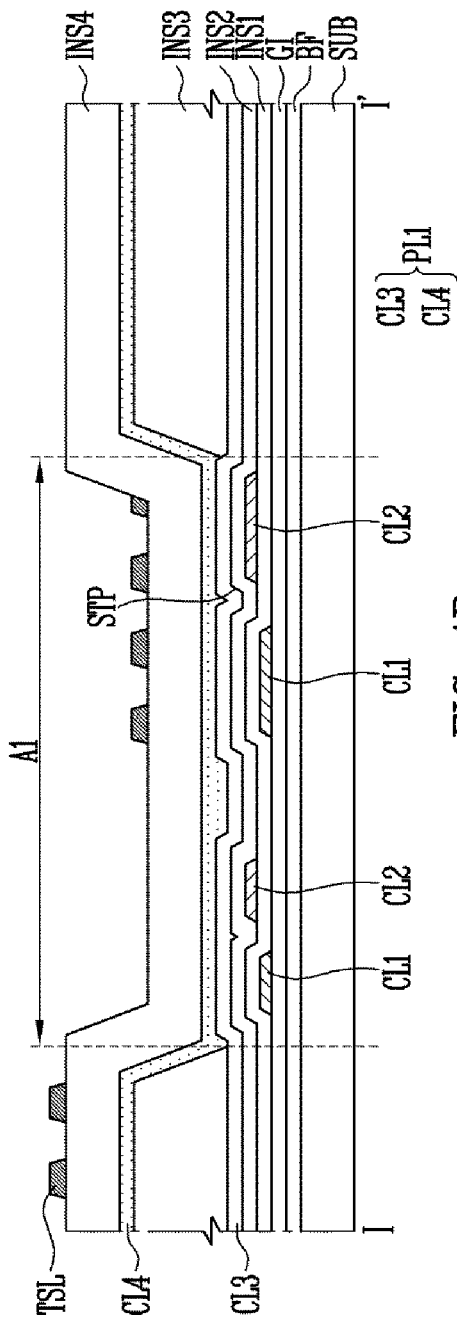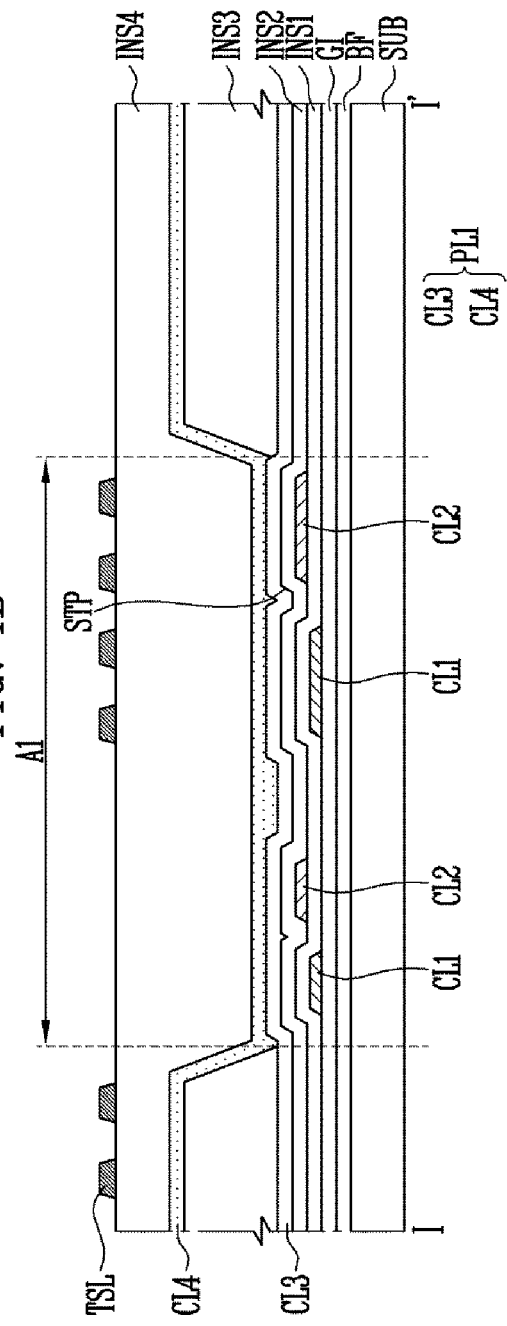

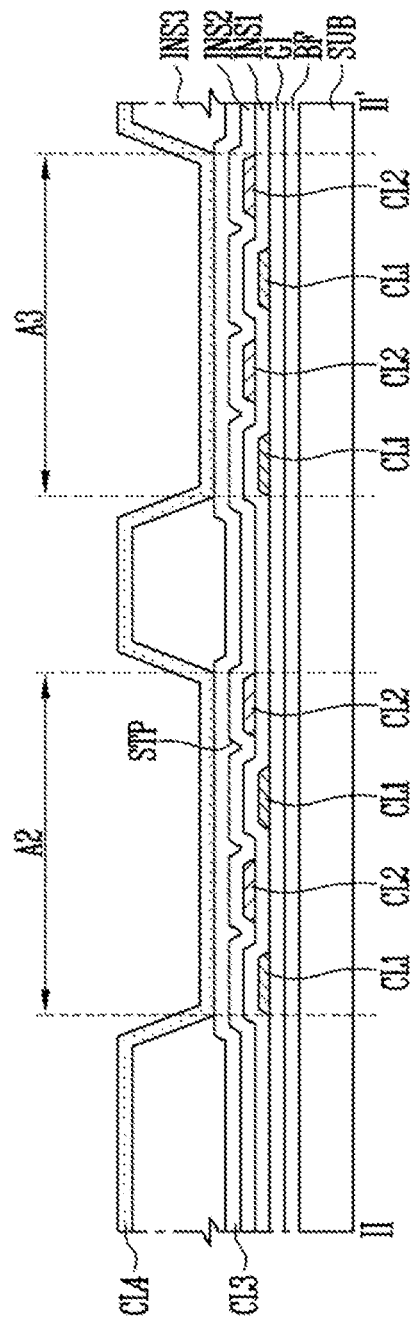

DISPLAY DEVICE

CROSS-REFERENCE TO RELATED APPLICATION

This application claims priority from and the benefit of Korean patent application 10-2019-0031985 filed on Mar. 20, 2019 which is hereby incorporated by reference for all purposes as if fully set forth herein.

BACKGROUND

Field

Exemplary implementations of the invention relate generally to a display device and, more specifically, to a display device including a touch sensor.

Discussion of the Background

In general, a display device includes pixels provided in a display region and a driver provided in a non-display region, and the pixels and the driver are connected to each other through conductive lines.

The display device includes a touch sensor disposed on the display region, to serve as a touch display device. A user may input information by touching an image displayed in the display region of the touch display device.

As the display device not only includes a touch sensor but also is being developed with an increased resolution, the number of the conductive lines disposed in the non-display region has been increasing. Furthermore, the non-display region has become smaller and/or narrower. Recently, studies for preventing a line defect (e.g., a short circuit or disconnection between lines) due to an increase in the number of lines have been conducted.

The above information disclosed in this Background section is only for understanding of the background of the inventive concepts, and, therefore, it may contain information that does not constitute prior art.

SUMMARY

Applicant discovered that when a display device includes first and second conductive lines that are arranged in alternating layers and produce a step difference, the step difference is even more pronounced in third and fourth conducting lines that are disposed above the first and second lines.

Display devices constructed according to the principles and exemplary implementations of the invention improve reliability and consume relatively low power through a more efficient arrangement of the conducting lines and insulating layers in the non-display area that reduces the likelihood of cracks or defects in the lines. For example, according to the principles and exemplary embodiments of the invention, a display device includes first and second conductive lines that are arranged in alternating layers (resulting in a step difference), and third and fourth conducting lines that are disposed above the first and second lines contact each other over a wide region exposed by one of the insulating layers. The wide contact region enables defects such as a crack and/or disconnection of the third and fourth lines to be prevented or at least reduced.

Additional features of the inventive concepts will be set forth in the description which follows, and in part will be apparent from the description, or may be learned by practice of the inventive concepts.

A display device constructed according to one or more embodiments includes: a substrate including a display region having pixels and a non-display region disposed along at least part of the periphery of the display region; first lines in the non-display region of the substrate; a first insulating layer disposed on the first lines; second lines disposed on the first insulating layer in the non-display region; a second insulating layer disposed on the second lines; a third line disposed on the second insulating layer, the third line overlapping portions of the first and second lines in the non-display region; a third insulating layer disposed on the third line, the third insulating layer exposing a portion of the third line in a first region that overlaps with the first and second lines; and a fourth line on the third insulating layer, the fourth line overlapping the third line and in direct contact with the third line in the first region.

The display device may further include: a fourth insulating layer disposed on the fourth line; and touch sensing lines disposed on the fourth insulating layer, the touch sensing line overlapping portions of the third and fourth lines in the non-display region.

At least some of the touch sensing lines may overlap with the first and second lines in the non-display region.

The first lines and the second lines may not overlap with each other.

The first lines and the second lines may be alternately disposed in a plan view.

An upper surface of the fourth insulating layer may be substantially flat.

The third insulating layer may include an opening having a width corresponding to a dimension of the first region, the third insulating layer overlapping the first and second lines in a second region disposed outside the first region.

The non-display region may include a first peripheral region adjacent to the display region, a second peripheral region spaced apart from the first peripheral region, and a bent region between the first peripheral region and the second peripheral region.

Parts of the first to fourth lines may be located in the second peripheral region.

The display device may further include: a fourth insulating layer disposed on the fourth line; and touch sensing lines disposed on the fourth insulating layer and overlapping at least portions of the third and fourth lines in the second peripheral region.

Some of the touch sensing lines may overlap with at least portions of the first and second lines.

The first and second lines may be configured to supply a data signal to data lines connected to the pixels.

The third and fourth lines may be configured to supply a driving power source for driving the pixels.

Widths of the third and fourth lines, which extend in a direction generally perpendicular to the directions of current flowing in the third and fourth lines, may be greater than widths of the first and second lines, which extend in a direction generally perpendicular to the directions of current flowing in the first and second lines.

The widths of the third and fourth lines may be greater than widths of the touch sensing lines, which in a direction generally perpendicular to the directions of current flowing in the touch sensing lines.

The first to fourth lines and the touch sensing lines may extend from the second peripheral region located between the display region and the bent region in the first peripheral region.

Parts of the first to fourth lines may be located in the first peripheral region.

The display device may further include: a fourth insulating layer disposed on the fourth line; and touch sensing lines disposed on the fourth insulating layer, the touch sensing line overlapping at least portions of the third and fourth lines in the first peripheral region.

Some of the touch sensing lines may overlap with at least portions of the first and second lines.

The first and second lines may include fan-out lines connected to scan lines or data lines, which are connected to the pixels, and the third and fourth lines may be configured to supply a driving power source for driving the pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 4A and 4B are sectional views illustrating exemplary structures of the display device taken along line I-I' of FIG. 3.

FIG. 5 is a sectional view taken along line II-II' of FIG. 3.

DETAILED DESCRIPTION

Figure 1A:
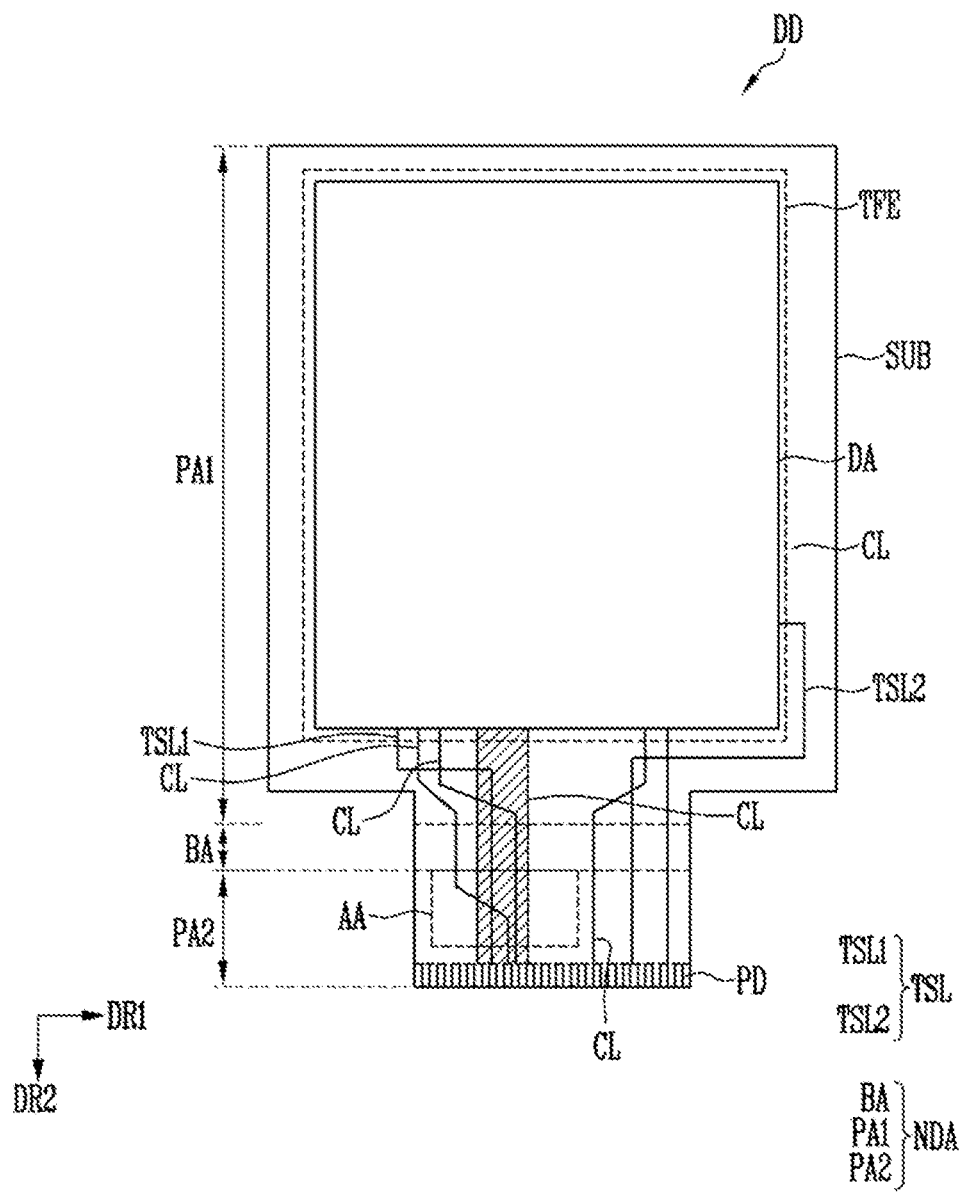
FIG. 1A is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described in more detail with reference to the accompanying drawings. Throughout the drawings, the same reference numerals are given to the same elements, and their repetitive descriptions will be omitted to avoid redundancy.

Figure 1B:
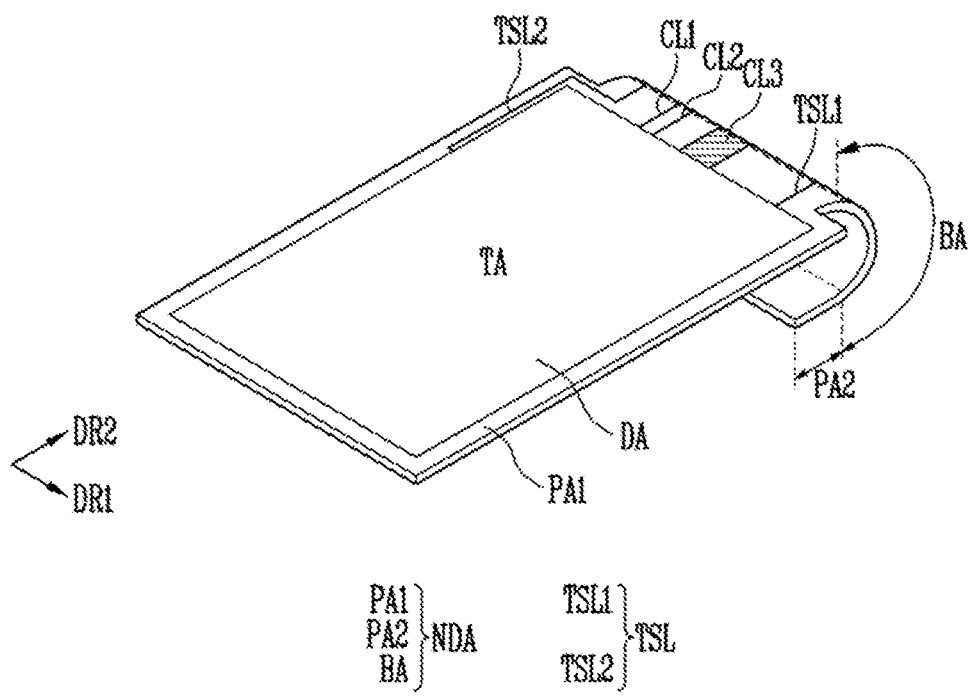
FIG. 1B is a perspective view of the display device of FIG. 1A.

FIG. 1A is a plan view of an exemplary embodiment of a display device constructed according to the principles of the invention. FIG. 1B is a perspective view of the display device of FIG. 1A.

Referring to FIGS. 1A and 1B, the display device DD may include a display panel including a substrate SUB, pixels provided on the substrate SUB, and an encapsulation layer TFE covering the pixels, and a touch sensor disposed on the display panel. The touch sensor may define a touch active region TA.

The substrate SUB may include a display region DA and a non-display region NDA provided at at least one side of the display region DA.

The substrate SUB may have an approximately rectangular shape. However, the shape of the substrate SUB is not limited thereto, and exemplary embodiments of the substrate SUB may have various shapes. For example, the substrate SUB may be provided in various shapes such as a closed polygon including linear sides, a circle, an ellipse, etc., including curved sides, and a semicircle, a semi-ellipse, etc., including linear and curved sides. In an exemplary embodiment, when the substrate SUB has linear sides, at least some of corners between the linear sides may be rounded.

The display region DA is a region in which pixels are provided such that an image is displayed. The display region DA may be provided in a shape corresponding to that of the substrate SUB. The pixels are provided on the display region DA of the substrate SUB. Each pixel may be a minimum unit for displaying an image, and may be provided in plurality.

The pixels may be implemented with an organic light emitting device including an organic layer. However, exemplary embodiments are not limited thereto, and the pixels may be implemented in various types such as a liquid crystal device, an electrophoretic device, and an electro-wetting device.

The non-display region NDA may be provided with conductive lines CL connected to the pixels and a driver that is connected to the conductive lines CL and drives the pixels.

The conductive lines CL provide a signal to each pixel, and may include scan lines, data lines, driving voltage lines, initialization lines, and the like. Also, the conductive lines CL may include fan-out lines connected to the scan lines, the data lines, the driving voltage lines, the initialization lines, and the like. The conductive lines CL may further include other lines, if necessary.

The conductive lines CL may extend to a second peripheral region PA2 via a first peripheral region PA1 and a bent region BA from the display region DA. At least some of the conductive lines CL may overlap with each other in a least one of the first peripheral region PA1, the bent region BA, and the second peripheral region PA2.

The driver may include a scan driver configured to provide a scan signal to each pixel along a scan line, a data driver configured to provide a data signal to each pixel along a data line, a timing controller configured to control the scan driver and the data driver, and the like.

In an exemplary embodiment, the scan driver may be mounted directly on the substrate SUB. In an exemplary embodiment, the scan driver may be formed in a separate chip to be provided in the form of chip on glass on the substrate SUB. Alternatively, the scan driver may be mounted on a printed circuit board to be connected to the substrate SUB through a connecting member.

In an exemplary embodiment, the data driver may be mounted directly on the substrate SUB. In an exemplary embodiment, the data driver may be formed in a separate chip to be connected to the substrate SUB. When the data driver is formed in the separate chip to be connected to the substrate SUB, the data driver may be provided in the form of chip on glass, chip on plastic, Chip On Film (COF), etc. Alternatively, the data driver may be mounted on a printed circuit board to be connected to the substrate SUB through a connecting member.

In an exemplary embodiment, the display panel may include the encapsulation layer TFE covering the display region DA and an encapsulation region corresponding to the encapsulation layer TFE.

In an exemplary embodiment, the touch active region TA may overlap with the display region DA. The touch sensor including a plurality touch sensing electrodes may be disposed in the touch active region TA. The touch sensor may be attached onto the display panel, or be included in the display panel.

In an exemplary embodiment, the touch sensor may include touch sensing electrodes and touch sensing lines connecting the touch sensing electrodes to a touch driver.

A first one of the touch sensing lines TSL1 may extend to the second peripheral region PA2 via the bent region BA from a lower end portion of the touch region TA. For example, the first touch sensing line TSL1 may include a part extending in a second direction DR2 from the touch active region TA (or the encapsulation region) and a part extending in a first direction DR1 perpendicularly intersecting the second direction DR2. Alternatively, the first touch sensing line TSL1 may further include a part obliquely extending with respect to the first and second directions DR1 and DR2.

A second one of the touch sensing lines TSL2 may extend to the second peripheral region PA2 via the bent region BA from one side portion of the touch region TA. The second touch sensing line TSL2 may include a part extending in the first direction DR1 from the touch region TA (or the encapsulation region). The second touch sensing line TSL2 may include at least three bent parts.

The first and second touch sensing lines TSL1 and TSL2 and the conductive lines CL may not be connected to/in contact with each other on the substrate SUB. FIG. 1A shows some of touch sensing lines and conductive signal lines of the display device DD such as the touch sensing lines TSL1 and TSL2 and the conductive lines CL. The touch sensing lines TSL1 and TSL2 and the conductive lines CL may have various shapes and arrangements in a plan view according to exemplary embodiments, positions where at least two of the first and second touch sensing lines TSL1 and TSL2 and the conductive lines CL overlap and intersect each other may be changed accordingly.

The non-display region NDA may further include an additional region protruding from a portion thereof. The additional region may protrude from sides of the non-display region NDA. In an exemplary embodiment, the data driver and/or the touch driver may be provided in or connected to the additional region. However, exemplary embodiments are not limited thereto, and various components may be disposed in the additional region. Also, the data driver and the touch driver may be integrated as a single driver.

In an exemplary embodiment, at least a portion of the display device DD may have flexibility, and the display device DD may be folded at the portion having the flexibility. For example, the display device DD may include the bent region BA that has flexibility and is able to be bent in one direction as shown in FIG. 1B.

In an exemplary embodiment, the non-display region NDA may include the bent region BA, the first peripheral region PA1, and the second peripheral region PA2. The first peripheral region PA1 may be a portion adjacent to the display region DA, and surround at least one side of the display region DA. The second peripheral region PA2 may be disposed to be spaced apart from the first peripheral region PA1 with the bent region BA interposed therebetween. The bent region BA may be spaced apart from the display region DA.

In the bent region BA, when a line about which the display device DD is folded is referred to as a folding line, the folding line is provided in the bent region BA. The term "folded" does not mean a fixed shape but refers to any shape deformable into another shape from the original shape, and includes, e.g., folded, curved, or rolled shapes like a roll along at least one specific line, i.e., a folding line.

In an exemplary embodiment, the data driver and/or the touch driver may be disposed in the form of COF on the second peripheral region PA2. In addition, a pad unit PD configured to include a pad connecting the conductive lines CL to the driver and a pad connecting the touch sensing lines TSL to the driver may be disposed in the second peripheral region PA2.

FIG. 1B shows the first and second touch sensing lines TSL1 and TSL2 of FIG. 1A and some of conductive signal lines of the display device DD such as first to third lines CL1, CL2, and CL3. The first to third lines CL1 to CL3 may be included in the conductive lines CL of FIG. 1A. In an exemplary embodiment, as shown in FIG. 1B, at least two of widths of first to third lines CL1, CL2, and CL3, which is defined as the dimension being generally perpendicular to the direction of current flowing in each of the first to third conductive lines CL1, CL2, and CL3, may be different from each other. For example, the first and second conductive lines CL1 and CL2 may be fan-out lines connected to data lines, and the third line CL3 may be a power line for supplying a driving power source to some components of the display device DD such as a pixel. In this case, the third line CL3 may be wider than the first and second lines CL1 and CL2.

In an exemplary embodiment, some of the conductive lines CL may be disposed in different layers to overlap with each other.

Figure 2:
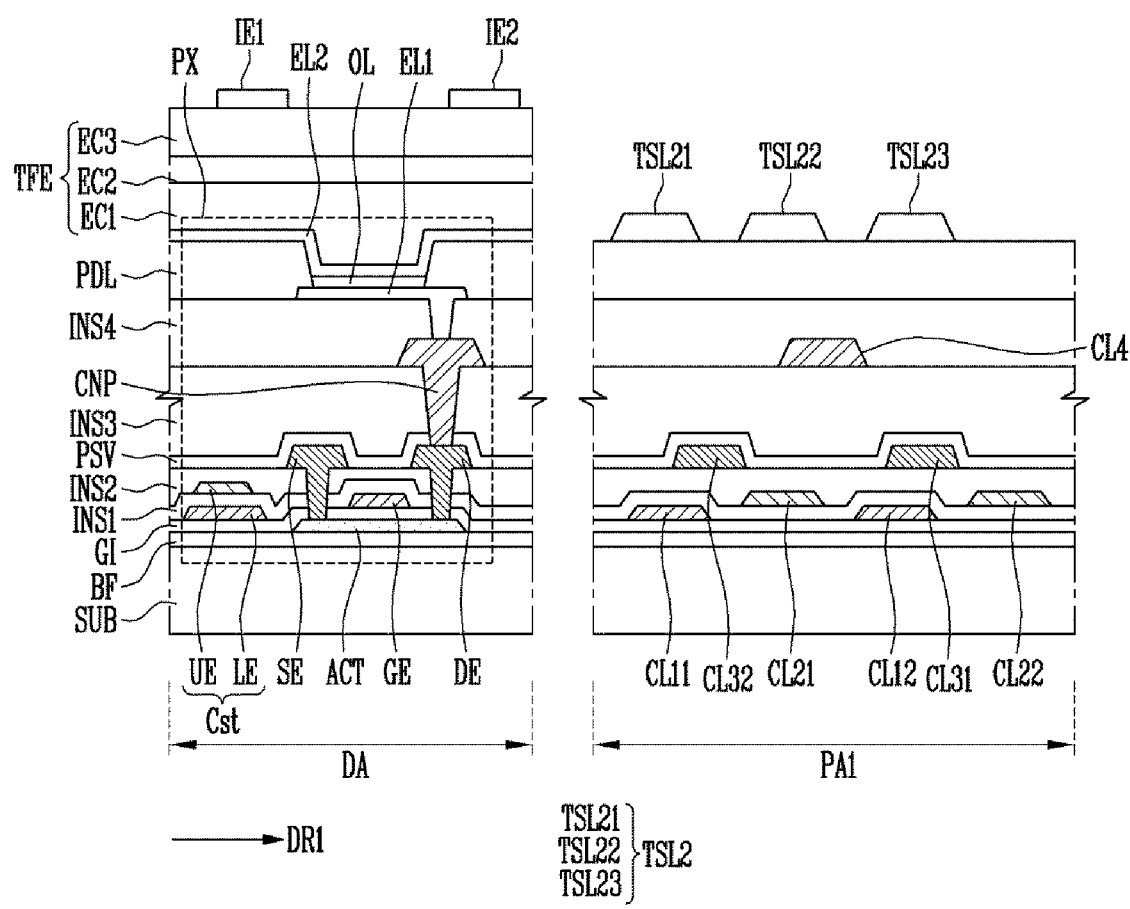
FIG. 2 is a sectional view of portions of the display region and non-display region adjacent to the display region in the display device of FIG. 1A.

FIG. 2 is a sectional view portions of the display region and the non-display region adjacent to the display region in the display device of FIG. 1A.

Referring to FIGS. 1A, 1B, and 2, touch sensing electrodes IE1 and IE2 disposed on an encapsulation layer TFE may be included in the display region DA, and second touch sensing lines TSL2 disposed on an insulating layer (e.g., the same layer as a pixel defining layer PDL) may be included at one side of the first peripheral region PA1.

For example, FIG. 2 illustrates a portion of the display region DA and a portion of the first peripheral region PA1, which is located at a right side of the display region DA of FIG. 2.

A plurality of pixels PX may be provided in the display region DA. Each pixel PX includes a transistor connected to at least some of the conductive lines CL, a light emitting device connected to the transistor, and a capacitor Cst. The transistor may include a driving transistor for controlling the light emitting device and a switching transistor for switching the driving transistor.

For convenience of description, a case where one transistor and one capacitor are provided in one pixel PX is illustrated in FIG. 2. However, exemplary embodiments are not limited thereto, and two or more transistors and at least one capacitor may be provided in one pixel PX.

The pixel PX is provided on a substrate SUB.

The substrate SUB may be made of an insulative material such as glass or resin. Also, the substrate SUB may be made of a material having flexibility to be bendable or foldable. The substrate SUB may have a single- or multi-layered structure.

A buffer layer BF may be formed on the substrate SUB. The buffer layer BF may prevent an impurity from being diffused into the switching and driving transistors. The buffer layer BF may include an inorganic insulating layer made of an inorganic material. For example, the buffer layer BF may be formed of silicon nitride, silicon oxide, silicon oxynitride, or the like. The buffer layer BF may be omitted according to the material and process conditions of the substrate SUB.

An active pattern ACT is provided on the buffer layer BF. The active pattern ACT may be formed of a semiconductor material. The active pattern ACT may include a source region, a drain region, and a channel region provided between the source region and the drain region. The active pattern ACT may be a semiconductor pattern made of poly-silicon, amorphous silicon, an oxide semiconductor, or the like.

A gate insulating layer GI is provided over the active pattern ACT. The gate insulating layer GI may include an inorganic insulating layer made of an inorganic material.

A gate electrode GE and a capacitor lower electrode LE are provided on the gate insulating layer GI. The gate electrode GE is formed to cover a region corresponding to the channel region of the active pattern ACT.

The gate electrode GE and the capacitor lower electrode LE may be made of a metal. For example, the gate electrode GE may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. Also, the gate electrode GE may be formed in a single layer or a multi-layer in which two or more materials among the metals and the alloys are stacked.

First lines CL11 and CL12 disposed at a side surface of the first peripheral region PA1 may be formed of the same material in the same layer as the gate electrode GE and the capacitor lower electrode LE. In an exemplary embodiment, the first lines CL11 and CL12 may include a line for supplying a power source to the scan driver, a line for supplying an initialization signal to the pixel PX, and the like. The first line CL1 of FIG. 1B may be composed of the first lines CL11 and CL12 disposed on the gate insulating layer GI.

A first insulating layer INS1 (e.g., an interlayer insulating layer) is provided over the gate electrode GE, the capacitor lower electrode LE, and the first lines CL11 and CL12. The first insulating layer INS1 may include an inorganic insulating layer made of an inorganic material. The inorganic material may include polysiloxane, silicon nitride, silicon oxide, silicon oxynitride, and the like.

A capacitor upper electrode UE is provided on the first insulating layer INS1. The capacitor upper electrode UE may be made of a metal. For example, the capacitor upper electrode UE may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. Also, the capacitor upper electrode UE may be formed in a single layer. However, the capacitor upper electrode UE is not limited thereto, and the capacitor upper electrode UE may be formed in a multi-layer in which two or more materials among the metals and the alloys are stacked.

The capacitor lower electrode LE and the capacitor upper electrode UE may form the capacitor Cst with the first insulating layer INS1 interposed therebetween.

Second lines CL21 and CL22 of the first peripheral region PA1 may be formed of the same material in the same layer as the capacitor upper electrode UE. In an exemplary embodiment, the second lines CL21 and CL22 may include a line for supplying a power source to the scan driver, a line for supplying an initialization signal to the pixel PX, and the like. Alternatively, the second lines CL21 and CL22 may be power lines for supplying a driving power source to the pixel PX. The second line CL2 of FIG. 1B may be composed of the second lines CL21 and CL22 disposed on the first insulating layer INS1.

In another exemplary embodiment, each of the first and second lines CL11, CL12, CL21, and CL22 may be fan-out lines connected to data lines and/or scan lines.

A second insulating layer INS2 is provided over the capacitor upper electrode UE and the second lines CL21 and CL22. The second insulating layer INS2 may include an inorganic insulating layer made of an inorganic material. The inorganic material may include polysiloxane, silicon nitride, silicon oxide, silicon oxynitride, and the like.

A source electrode SE and a drain electrode DE are provided on the second insulating layer INS2. The source electrode SE and the drain electrode DE are respectively in contact with the source region and the drain region of the active pattern ACT through contact holes formed in the second insulating layer INS2, the first insulating layer INS1, and the gate insulating layer GI.

The source electrode SE and the drain electrode DE may be made of a metal. For example, the source electrode SE and the drain electrode DE may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof.

Third lines CL31 and CL32 may be disposed on the second insulating layer INS2 of the first peripheral region PA1. The third lines CL31 and CL32 may be formed of the same material in the same layer as the source electrode SE and the drain electrode DE. The third lines CL31 and CL32 may include at least one of data lines, initialization lines or some scan lines, and power lines. The third line CL3 of FIG. 1B may be composed of the third lines CL31 and CL32.

A passivation layer PSV may be provided over the source electrode SE and the drain electrode DE. The passivation layer PSV may include an inorganic insulating layer made of an inorganic material. The inorganic material may include polysiloxane, silicon nitride, silicon oxide, silicon oxynitride, and the like.

A third insulating layer INS3 may be provided on the passivation layer PSV. The third insulating layer INS3 may include an organic insulating layer made of an organic material. The organic material may include an organic insulating material such as a polyacryl-based compound, a polyimide-based compound, a fluorine-based compound such as Teflon, or a benzocyclobutene-based compound.

A connection pattern CNP may be provided on the third insulating layer INS3. The connection pattern CNP is connected to the drain electrode DE of the transistor through a contact hole penetrating the third insulating layer INS3 and the passivation layer PSV. The connection pattern CNP may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof.

Fourth line CL4 of the first peripheral region PA1 may be formed of the same material in the same layer as the connection pattern CNP. For example, the fourth line CL4 may be a line for supplying a partial power source supplied to a dummy power line, the scan driver, or the pixel PX.

A fourth insulating layer INS4 may be provided over the connection pattern CNP. The fourth insulating layer INS4 may include an organic insulating layer made of an organic material. The organic material may include an organic insulating material such as a polyacryl-based compound, a polyimide-based compound, a fluorine-based compound such as Teflon, or a benzocyclobutene-based compound.

A first electrode EL1 may be provided on the fourth insulating layer INS4. The first electrode EL1 may be connected to the connection pattern CNP through a contact hole penetrating the fourth insulating layer INS4. In some exemplary embodiments, the first electrode EL1 may be used as one of an anode and a cathode.

The first electrode EL1 may be made of a metal layer including Ag, Mg, Al, Pt, Pd, Au, Ni, Nd, Ir, Cr, any alloy thereof, etc. and/or indium tin oxide (ITO), indium zinc oxide (IZO), zinc oxide (ZnO), indium tin zinc oxide (ITZO), etc.

The pixel defining layer PDL defining a pixel region to correspond to each pixel PX is provided on the substrate SUB on which the first electrode EL1 is formed. The pixel defining layer PDL may include an organic insulating layer made of an organic material. The organic material may include an organic insulating material such as a polyacryl-based compound, a polyimide-based compound, a fluorine-based compound such as Teflon, or a benzocyclobutene-based compound.

The pixel defining layer PDL may expose an upper surface of the first electrode EL1 and protrude from the substrate SUB along the circumference of the pixel PX.

An emission layer OL may be provided in the pixel region surrounded by the pixel defining layer PDL. The emission layer OL may be provided in a single layer, but be provided in a multi-layer including various functions. When the emission layer OL is provided as the multi-layer, the emission layer OL may have a structure in which a hole injection layer (HIL), a hole transport layer (HTL), an organic emission layer (EML), an electron transport layer (ETL), an electron injection layer (EIL), and the like are stacked in a single or complex structure.

A second electrode EL2 may be provided on the organic layer OL. The second electrode EL2 may be provided for each pixel PX. However, the second electrode EL2 may be provided to cover a majority of the display region DA, and be shared by a plurality of pixels PX.

In some exemplary embodiments, the second electrode EL2 may be used as one of an anode and a cathode. When the first electrode EL1 is the anode, the second electrode EL2 may be used as the cathode. When the first electrode EL1 is the cathode, the second electrode EL2 may be used as the anode.

The second electrode EL2 may be made of a metal layer including Ag, Mg, Al, Pt, Pd, Au, Ni, Nd, Ir, Cr, etc. and/or a transparent conductive layer including indium tin oxide (ITO), indium zinc oxide (IZO), zinc oxide (ZnO), indium tin zinc oxide (ITZO), etc. In an exemplary embodiment, the second electrode EL2 may be provided in a multi-layer having two or more layers including a metal thin film. For example, the second electrode EL2 may be provided in a triple layer of ITO/Ag/ITO.

A plurality of second touch sensing lines TSL21, TSL22, and TSL23 included in the second touch sensing line TSL2 may be formed of the same material in the same layer as the second electrode EL2. For example, the second touch sensing lines TSL2 may be disposed on the organic insulating layer formed through the process of forming the pixel defining layer PDL. The plurality of second touch sensing lines TSL21, TSL22, and TSL23 may be arranged along the first direction DR1, and extend toward the bent region BA.

However, this arrangement is merely illustrative, and the second touch sensing lines TSL2 may be disposed on the fourth insulating layer INS4. That is, the second touch sensing lines TSL2 may be formed of the same material in the same layer as the connection pattern CNP or the first electrode ELL The encapsulation layer TFE may be provided over the second electrode EL2. The encapsulation layer TFE may be provided in a single layer, but be provided in a multi-layer. In an exemplary embodiment, the encapsulation layer TFE may include first to third encapsulation layers EC1, EC2, and EC3. The first to third encapsulation layers EC1, EC2, and EC3 may be made of an organic material and/or an inorganic material. The third encapsulation layer EC3 located at the uppermost side of the encapsulation layer TFE may be made of an inorganic material. For example, the first encapsulation layer EC1 may be made of an inorganic material, the second encapsulation layer EC2 may be made of an organic material, and the third encapsulation layer EC3 may be made of an inorganic material. As compared with the organic material, inorganic material is more resistant to moisture or oxygen penetration, but the inorganic material is more prone to cracking due to its low elasticity or flexibility. The first encapsulation layer EC1 and the third encapsulation layer EC3 are formed of an inorganic material, and the second encapsulation layer EC2 is formed of an organic material, so that the propagation of cracks can be prevented. The layer made of the organic material such as the second encapsulation layer EC2 may be completely covered by the third encapsulation layer EC3 such that an end portion of the second encapsulation layer EC2 is not exposed to the outside. The organic material may include an organic insulating material such as a polyacryl-based compound, a polyimide-based compound, a fluorine-based compound such as Teflon, or a benzocyclobutene-based compound. The inorganic material may include inorganic insulating materials such as polysiloxane, silicon nitride, silicon oxide, and silicon oxynitride.

The encapsulation layer TFE may cover the display region DA, and extend up to the outside of the display region DA.

In an exemplary embodiment, the third insulating layer INS3, the fourth insulating layer INS4, and/or the pixel defining layer PDL, which are made of an organic material, do not continuously extend up to the bent region BA, and portions of third insulating layer INS3, the fourth insulating layer INS4, and/or the pixel defining layer PDL may be removed along the circumference of the display region DA. Accordingly, an upper surface of the pixel defining layer PDL, a side surface of the pixel defining layer PDL, the exposed third insulating layer INS3, and/or the fourth insulating layer INS4 are encapsulated by the encapsulation layer TFE, so that their exposure to the outside can be prevented.

A first touch sensing electrode IE1 and a second touch sensing electrode IE2 may be disposed on the encapsulation layer TFE. In an exemplary embodiment, touch sensing lines respectively connected to the first and second touch sensing electrodes IE1 and IE2 may be disposed on the encapsulation layer TFE. For example, the second touch sensing line TSL2 may extend onto an insulating layer of the first peripheral region PA1 via upper and side surfaces of the encapsulation layer TFE.

Each of the first sensing electrode IE1, the second sensing electrode IE2, the first touch sensing line TSL1, and the second touch sensing line TSL2 may have a single- or multi-layered structure. Each of the first sensing electrode IE1, the second sensing electrode IE2, the first touch sensing line TSL1, and the second touch sensing line TSL2, which has the single-layered structure, may include a metal layer or a transparent conductive layer. The metal layer may include molybdenum, silver, titanium, copper, aluminum, and alloys thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include conductive polymer such as PEDOT, metal nano wire, graphene, etc. Each of the first sensing electrode IE1, the second sensing electrode IE2, the first touch sensing line TSL1, and the second touch sensing line TSL2, which has the multi-layered structure, may include multi-layered metal layers. The multi-layered metal layers may have a triple structure of, for example, titanium/aluminum/titanium.

Each of the first sensing electrode IE1, the second sensing electrode IE2, the first touch sensing line TSL1, and the second touch sensing line TSL2 may have a mesh pattern having a plurality of mesh holes.

The first touch sensing line TSL1 and the second touch sensing line TSL2 may extend to the second peripheral region PA2 via the bent region BA.

Figure 3:
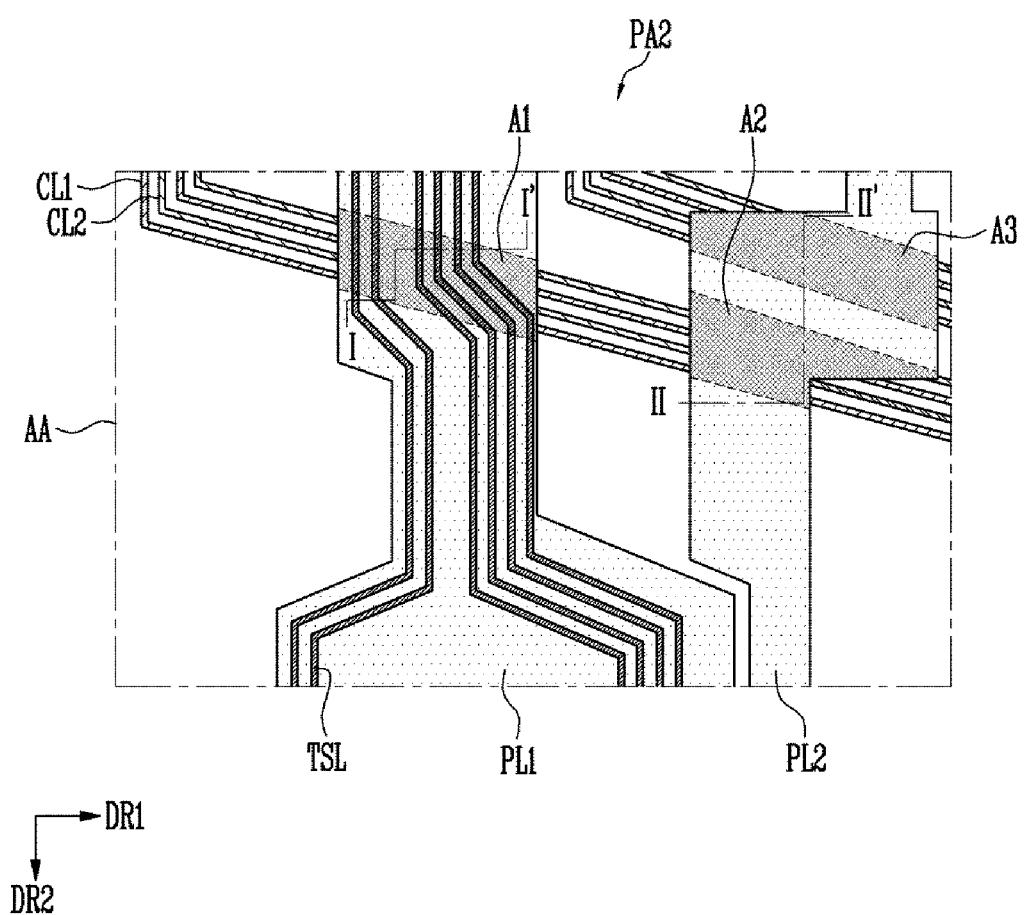
FIG. 3 is an enlarged, plan view of portion AA shown in FIG. 1A.

FIG. 3 is an enlarged, plan view of portion AA shown in FIG. 1A.

Referring to FIG. 3, a first line CL1, a second line CL2, a first power line PL1, a second power line PL2, a touch sensing line TSL may be disposed in the second peripheral region PA2 of the display device DD. The first line CL1, the second line CL2, the first power line PL1, and the second power line PL2 may form all or some of the conductive lines CL of FIG. 1A, and the touch sensing lines TSL may form all or some of the first touch sensing line TSL1 and/or the second touch sensing line TSL2 of FIG. 1A.

The lines shown in FIG. 3 are merely illustrative for describing an exemplary embodiment of the second peripheral region PA2 of display device. Thus, other lines and components may be further included in the second peripheral region PA2 of the display device DD.

The first and second lines CL1 and CL2 may be disposed in different insulating layers. The first and second lines CL1 and CL2 may be alternately disposed in a plan view and disposed in different layers. For example, the distance between the first line CL1 and the second line CL2 may be about 1 μm or less. The first and second lines CL1 and CL2 may be fan-out lines connecting data lines of the display region DA to the data driver. However, exemplary embodiments are not limited thereto. For example, each of the first and second lines CL1 and CL2 may be a power line for driving the scan driver, a clock signal line, a power line for supplying an initialization signal, or a scan line for supplying a scan signal to a pixel.

In an exemplary embodiment, each of the first and second lines CL1 and CL2 may include a part extending in the second direction DR2 that is a direction facing the pad unit PD from the bent region BA and a part extending in an oblique direction with respect to the second direction DR2.

Since the first and second lines CL1 and CL2 are disposed in different layers, a step difference may occur between insulating layers respectively covering the first and second lines CL1 and CL2. In particular, portions of the insulating layers overlapping a region disposed between the first line CL1 and the second line CL2 may have a step larger than other portions, and the step may cause a line (conductive pattern) to be cracked. Such a crack increases the resistance of the line, and causes heat generation when the display device DD is driven.

In an exemplary embodiment, the first and second power lines PL1 and PL2 may be disposed in a layer disposed above the first and second lines CL1 and CL2. The first and second power lines PL1 and PL2 may extend in the second direction DR2. The first and second power lines PL1 and PL2 may be spaced apart from each other.

The first and second power lines PL1 and PL2 may include third and fourth lines that are disposed in different layers and have at least portions in contact with each other. Portions of the third and fourth lines included in the first power line PL1 may be in direct contact with each other, and other portions of the third and fourth lines included in the first power line PL1 may overlap with each other with an insulating layer interposed therebetween. Similarly, portions of the third and fourth lines included in the second power line PL2 may be in direct contact with each other, and other portions of the third and fourth lines included in the second power line PL2 may overlap with each other with an insulating layer interposed therebetween.

A portion of the first power line PL1 may overlap with the first and second lines CL1 and CL2. For example, the first power line PL1 may overlap with the first and second lines CL1 and CL2 in a first region A1. Similarly, the second power line PL2 may overlap with the first and second lines CL1 and CL2 in a second region A2 and a third region A3.

A step having a relatively narrow width, which is caused by the disposition of the first and second lines CL1 and CL2 in different layers may exist in the first to third regions A1 to A3, such as shown in FIGS. 4A-4B discussed below. For example, disposition of the first and second lines CL1 and CL2 in different layers causes relatively many steps in the first to third regions A1 to A3, as differences in height become more pronounced in subsequent layers. Accordingly, a crack caused by the narrow step may occur in the first and second power lines PL1 and PL2. The display device DD includes a structure suitable for preventing occurrence of the crack caused by the groove, and this will be described with reference to FIGS. 4A, 4B, and 5.

In an exemplary embodiment, the width of the first and second power lines PL1 and PL2 may be greater than the width of the first and second lines CL1 and CL2. The first and second power lines PL1 and PL2 are to stably supply a DC power voltage to all the pixels, and hence influence of line resistance, RC delay, etc. needs to be minimized. Therefore, the first and second power lines PL1 and PL2 may be formed to have a width as wide as possible according to the design of the display device DD. On the same plane, the width of each of the lines may refer to a length in a direction perpendicular to the direction of current flowing in the line.

Also, the first and second power lines PL1 and PL2 may have a structure in which a plurality of conductive layers (line layers) are overlappingly connected to each other so as to minimize the influence of line resistance, RC delay, etc. For example, the first power line PL1 may have a structure in which a conductive layer disposed on the second insulating layer INS2 and a conductive layer disposed on the third insulating layer IN3 overlap with each other. Similarly, the second power line PL2 may have a structure in which a conductive layer disposed on the second insulating layer INS2 and a conductive layer disposed on the third insulating layer IN3 overlap with each other.

In the second peripheral region PA2, touch sensing lines TSL may be disposed on and overlap the first power line PL1. The touch sensing lines TSL may be disposed on the first power line PL1 with an insulating layer interposed therebetween. In the first region A1, the first line CL1, the second line CL2, the first power line PL1, and the touch sensing line TSL may be disposed to overlap with each other.

However, this is merely illustrative, and the positions of the touch sensing lines TSL are not limited thereto. At least some of the touch sensing lines TSL may overlap with the second power line PL2 as shown in FIG. 3, and others may be formed at a portion at which the first and second power lines PL1 and PL2 are not located.

The touch sensing lines TSL may extend to the encapsulation layer TFE, and extend up to the second peripheral region PA2 via the first peripheral region PA1 and the bent region BA.

FIGS. 4A and 4B are sectional views illustrating exemplary structures of the display device taken along line I-I' of FIG. 3.

In FIGS. 4A and 4B, components identical to those described with reference to FIGS. 2 and 3 are designated by like reference numerals, and therefore, repetitive descriptions will be omitted to avoid redundancy.

Referring to FIGS. 2, 3, 4A, and 4B, first to fourth lines CL1 to CL4 electrically connected to the display panel and touch sensing lines TSL connected to the touch sensor may be disposed in the second peripheral region PA2.

The first line CL1 may be disposed on the gate insulating layer GI, and the first insulating layer INS1 may be disposed over the first line CL1. The second line CL2 may be disposed on the first insulating layer INS1, and the second insulating layer INS2 may be disposed over the second line CL2.

The first lines CL1 and the second lines CL2 may not overlap with each other. In an exemplary embodiment, when viewed in plan, the first lines CL1 and the second lines CL2 may be alternately disposed as shown in FIG. 3.

In an exemplary embodiment, the first and second lines CL1 and CL2 may supply a data signal to data lines. For example, the first and second lines CL1 and CL2 may be fan-out lines connected to the data lines.

A narrow step STP (difference in height) may be formed at an upper surface of the second insulating layer INS2 when the first and second insulating layers INS1 and INS2 are stacked as the first and second lines CL1 and CL2 are alternately disposed in different layers.

The third line CL3 may be disposed on the second insulating layer INS2 while overlapping with the first and second lines CL1 and CL2. The third line CL3 may form a portion of a first power line PL1 for supplying a first driving power source (e.g., a power source ELVDD). The third line CL3 may have a width greater than the widths of the first and second lines CL1 and CL2. In a first region A1 in which the first and second lines CL1 and CL2 are alternately disposed, an upper surface of the third line CL3 may be unevenly formed along the step STP of the second insulating layer INS2.

The third insulating layer INS3 may be disposed over the third line CL3. In an exemplary embodiment, the third insulating layer INS3 may be formed such that the first region A1 of the third line CL3 is exposed. That is, the third insulating layer INS3 may include an opening corresponding to the first region A1.

The third insulating layer INS3 is formed thicker than other conductive layers or insulating layers. The fourth line CL4 may be formed on the third line CL3 and the third insulating layer INS3 by various deposition methods (for example, physical vapor deposition (PVD) such as evaporation, sputtering, or the like). However, such a metal deposition method (or metallization) has a difficulty in filling a narrow space (narrow valley). In particular, if the relatively thick third insulating layer INS3 includes an opening only in a very narrow portion corresponding to one step STP, a width of the step STP is relatively narrow (small) compared with a depth corresponding to the step STP and the opening at which the metal corresponding to the fourth line CL4 is to be deposited. Therefore, some portions of the step STP may not be covered by the deposited metal corresponding to the fourth line CL4 (step coverage characteristic). Thus, a portion of the fourth line CL4 disposed on the third insulating layer INS3 may be disconnected due to the narrow step, and/or a crack may occur in the fourth line CL4 due to the step difference.

In order to solve this problem, the first power line PL1 may be designed such that the third line CL3 and the fourth line CL4 are in direct contact with each other in a wide region such as the first region A1 by removing a portion of the third insulating layer INS3 overlapping the first region A1.

The fourth line CL4 may be disposed on the third line CL3 and the third insulating layer INS3. The fourth line CL4 may overlap with the third line CL3 on the third insulating layer INS3, and be in direct contact with the third line CL3 in the first region A1.

The third line CL3 and the fourth line CL4 may constitute the first power line PL1. Since the fourth line CL4 contacts the third line CL3 over a wide area in the first region A1 in which steps STP are formed due to the first line CL1 and the second line CL2 being alternatively disposed in different layers, the line resistance of the first power line PL1 in the second peripheral region PA2 can be decreased, and occurrence of a crack in the fourth line CL4 in the first region A1 and heat generation due to the occurrence of the crack can be prevented or at least reduced. In addition, the step difference of an upper surface of the fourth line CL4 in the first region A1 may be minimized.

The fourth insulating layer INS4 may be disposed over the fourth line CL4. In an exemplary embodiment, the fourth insulating layer INS4 may be identical to the fourth insulating layer INS4 or the pixel defining layer PDL of the display region DA shown in FIG. 2. However, this is merely illustrative, and the fourth insluting layer INS4 may be formed through a process different from that of the fourth insulating layer INS4 or the pixel defining layer PDL of the display region DA.

In an exemplary embodiment, as shown in FIG. 4A, an upper surface of the fourth insulating layer INS4 may be formed along an upper step of the fourth line CL4. Since the fourth insulating layer INS4 is disposed on the fourth line CL4 having a minimized step difference, a step difference (and unevenness) of the fourth insulating layer INS4 in the first region A1 in which the first and second lines CL1 and CL2 are alternately disposed can also be minimized.

In an exemplary embodiment, as shown in FIG. 4B, the upper surface of the fourth insulating layer INS4 may be substantially flat. Accordingly, the step difference of the fourth insulating layer INS4 according to the step difference of the fourth line CL4 can be removed or minimized.

Touch sensing lines TSL extending from the touch active region TA may be disposed on the fourth insulating layer INS4.

The touch sensing lines TSL may overlap with the first power line PL1. In addition, a portion of the touch sensing lines TSL may overlap with portions of the first and second lines CL1 and CL2. The touch sensing lines TSL may have a width narrower than those of the third and fourth lines CL3 and CL4.

The touch sensing lines TSL are disposed on the fourth insulating layer INS4 having a relatively high flatness, so that a defect such as occurrence of a crack of the touch sensing lines TSL or a disconnection of the touch sensing lines TSL in the first region Al can be prevented or at least reduced. Thus, the accuracy and sensitivity of touch sensing can be improved.

FIG. 5 is a sectional view taken along line II-II' of FIG. 3.

In FIG. 5, components identical to those described with reference to FIG. 4A are designated by like reference numerals, and therefore, repetitive descriptions will be omitted to avoid redundancy.

Referring to FIG. 5, first to fourth lines CL1 to CL4 electrically connected to the display panel may be disposed in the second peripheral region PA2.

The first lines CL1 and the second lines CL2 do not overlap with each other. In an exemplary embodiment, when viewed in plan, the first lines CL1 and the second lines CL2 may be alternately disposed and in different layers.

In an exemplary embodiment, the first and second lines CL1 and CL2 may supply a data signal to data lines. For example, the first and second lines CL1 and CL2 may be fan-out lines connected to the data lines.

The third line CL3 may be disposed on the second insulating layer INS2 while overlapping with the first and second lines CL1 and CL2. The third line CL3 may form a portion of a second power line PL2 for supplying a second driving power source (e.g., a power source ELVSS). The third line CL3 may have a width greater than the widths of the first and second lines CL1 and CL2.

The third line CL3 may include a second region A2 and a third region A3, which overlap with the first and second lines CL1 and CL2. Each of the second and third regions A2 and A3 is a portion at which the distance between adjacent first and second lines CL1 and CL2 is 1 µm or less, and may be a region overlapping with the third line CL3.

The third insulating layer INS3 may be disposed such that the second region A2 and the third region A3 of the third line CL3 are exposed. That is, the third insulating layer INS3 may include openings corresponding to the second region A2 and the third region A3.

The fourth line CL4 may be disposed on the third line CL3 and the third insulating layer INS3. The fourth line CL4 may overlap with the third line CL3 on the third insulating layer INS3, and be in direct contact with the third line CL3 in the second region A2 and the third region A3. The third line CL3 and the fourth line CL4 may form the second power line PL2.

Since the fourth line CL4 contacts the third line CL3 over a wide area in the second and third regions A2 and A3 having the first line CL1 and the second line CL2 alternatively disposed in different layers, the line resistance of the second power line PL2 in the second peripheral region PA2 can be decreased, and occurrence of a crack in the fourth line CL4 in the second and third regions A2 and A3 and heat generation due to the occurrence of the crack can be prevented or at least reduced.

However, this is merely illustrative, and the third insulating layer INS3 may have an opening with respect to a region in which the first and second lines CL1 and CL2 are alternately disposed at a distance of 1 µm or less, when a conductive layer or lines are disposed in the corresponding region. For example, a stack structure identical or similar to the structure of FIGS. 4A, 4B, and 5 may be applied even to the first peripheral region PA1 between the bent region BA and the display region DA.

As described above, in the display device DD in accordance with one or more exemplary embodiments, an opening is formed in the third insulating layer INS3 that overlaps the first region A1, the second region A2, and the third region A3, in which the first and second lines CL1 and CL2 are alternately disposed at a predetermined distance, and the third and fourth lines CL3 and CL4 contact each other in the first to third regions A1 to A3 over a wide area. Thus, defects such as a crack and/or disconnection of each of the third and fourth lines CL3 and CL4 may be prevented or at least reduced even though layers below the third and fourth lines CL3 and CL4 include a step STP due to the first and second lines CL1 and CL2 being alternately disposed in different layers. Accordingly, line resistance of the third and fourth lines CL3 and CL4 and heat generation can be decreased, and therefore, the display device DD may have an improved reliability and consume relatively low power.

In addition, the step difference and unevenness of an upper surface of the fourth line CL4 in the first to third regions A1 to A3 may be minimized since the defects of the third and fourth lines CL3 and CL4 are prevented or at least reduced in the first to third regions A1 to A3, and therefore, defects such as a crack and/or disconnection of the touch sensing lines TSL disposed on the first region A1 can be prevented or at least reduced. Thus, the accuracy and sensitivity of touch sensing can be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate including a display region having pixels and a non-display region disposed along at least part of the periphery of the display region;
   first lines in the non-display region of the substrate;
   a first insulating layer disposed on the first lines;
   second lines disposed on the first insulating layer in the non-display region;
   a second insulating layer disposed on the second lines;
   a third line disposed on the second insulating layer, the third line overlapping portions of the first and second lines in the non-display region;
   a third insulating layer disposed on the third line and including an opening exposing a portion of the third line in a first, the opening overlapping the first and second lines; and
   a fourth line on the third insulating layer, the fourth line overlapping the third line and being in direct contact with the third line through the opening in the first region.

2. The display device of claim 1, further comprising:
   a fourth insulating layer disposed on the fourth line; and
   touch sensing lines disposed on the fourth insulating layer, the touch sensing line overlapping portions of the third and fourth lines in the non-display region.

3. The display device of claim 2, wherein at least some of the touch sensing lines overlap with the first and second lines in the non-display region.

4. The display device of claim 2, wherein an upper surface of the fourth insulating layer is substantially flat.

5. The display device of claim 1, wherein the first lines and the second lines do not overlap with each other.

6. The display device of claim 5, wherein the first lines and the second lines are alternately disposed in a plan view.

7. The display device of claim 1, wherein the opening has a width corresponding to a dimension of the first region, the third insulating layer overlapping the first and second lines in a second region disposed outside the first region.

8. The display device of claim 1, wherein the non-display region includes a first peripheral region adjacent to the display region, a second peripheral region spaced apart from the first peripheral region, and a bent region between the first peripheral region and the second peripheral region.

9. The display device of claim 8, wherein parts of the first to fourth lines are located in the second peripheral region.

10. The display device of claim 9, further comprising:
a fourth insulating layer disposed on the fourth line; and
touch sensing lines disposed on the fourth insulating layer and overlapping at least portions of the third and fourth lines in the second peripheral region.

11. The display device of claim 10, wherein some of the touch sensing lines overlap with at least portions of the first and second lines.

12. The display device of claim 10, wherein the first and second lines are configured to supply a data signal to data lines connected to the pixels.

13. The display device of claim 10, wherein the third and fourth lines are configured to supply a driving power source for driving the pixels.

14. The display device of claim 13, wherein widths of the third and fourth lines, which extend in a direction generally perpendicular to the directions of current flowing in the third and fourth lines, are greater than widths of the first and second lines, which extend in a direction generally perpendicular to the directions of current flowing in the first and second lines.

15. The display device of claim 14, wherein the widths of the third and fourth lines are greater than widths of the touch sensing lines, which extend in a direction generally perpendicular to the directions of current flowing in the touch sensing lines.

16. The display device of claim 13, wherein the first to fourth lines and the touch sensing lines extend from the second peripheral region to be located between the display region and the bent region in the first peripheral region.

17. The display device of claim 8, wherein parts of the first to fourth lines are located in the first peripheral region.

18. The display device of claim 17, further comprising:
a fourth insulating layer disposed on the fourth line; and
touch sensing lines disposed on the fourth insulating layer, the touch sensing line overlapping at least portions of the third and fourth lines in the first peripheral region.

19. The display device of claim 18, wherein some of the touch sensing lines overlap with at least portions of the first and second lines.

20. The display device of claim 18, wherein the first and second lines comprise fan-out lines connected to scan lines or data lines, which are connected to the pixels, and
wherein the third and fourth lines are configured to supply a driving power source for driving the pixels.

* * * * *